(12) United States Patent
German et al.

(10) Patent No.: US 10,938,167 B2
(45) Date of Patent: Mar. 2, 2021

(54) AUTOMATED CAPTURE OF INFORMATION ABOUT FIXED CABLING

(71) Applicant: CommScope Technologies LLC, Hickory, NC (US)

(72) Inventors: Michael Gregory German, Secaucus, NJ (US); Ryan E. Enge, Carrollton, TX (US); Andrew P. Roberts, Wrexham (GB); Matias Peluffo, Singapore (SG); Masood Shariff, Tinton Falls, NJ (US); Ernest C Pickens, Fairview, TX (US)

(73) Assignee: CommScope Technologies LLC, Hickory, NC (US)

( * ) Notice: Subject to any disclaimer, the term of this patent is extended or adjusted under 35 U.S.C. 154(b) by 71 days.

(21) Appl. No.: 16/293,536

(22) Filed: Mar. 5, 2019

(65) Prior Publication Data

US 2019/0280438 A1 Sep. 12, 2019

Related U.S. Application Data

(60) Provisional application No. 62/639,371, filed on Mar. 6, 2018.

(51) Int. Cl.
*H01R 13/703* (2006.01)
*H04Q 1/02* (2006.01)
*G01R 31/70* (2020.01)

(52) U.S. Cl.
CPC .......... *H01R 13/703* (2013.01); *G01R 31/70* (2020.01); *H04Q 1/13* (2013.01)

(58) Field of Classification Search
CPC ......... G01R 31/70; H04Q 1/13; H01R 13/703
(Continued)

(56) References Cited

U.S. PATENT DOCUMENTS

| | | |
|---|---|---|
| 5,394,503 A | 2/1995 | Dietz, Jr. et al. |
| 5,406,260 A | 4/1995 | Cummings et al. |

(Continued)

FOREIGN PATENT DOCUMENTS

| | | |
|---|---|---|
| WO | 2019006026 A1 | 1/2019 |
| WO | 2020117449 A1 | 6/2020 |

OTHER PUBLICATIONS

Gabara, "Phantom Mode Signaling in VLSI Systems", 2001, pp. 88-100, IEEE.

(Continued)

*Primary Examiner* — Hemant S Patel
(74) *Attorney, Agent, or Firm* — Fogg & Powers LLC

(57) ABSTRACT

One embodiment is directed to detecting that a cable has been connected to a port of patching equipment and detecting that the cable is no longer connected to said port. In response to detecting that the cable is no longer connected, information associated with fixed cabling coupled to said port that is captured by a cable tester is downloaded to a controller. The downloaded information is associated with said port and the downloaded information and association information is locally stored at the controller. The locally stored information can then be used to create and/or populate objects in a database. Another embodiment is directed to including a storage device and a wireless interface in patching equipment or other equipment such as an outlet or consolidation point for use in writing information to the storage device and reading information from the storage device via the wireless interface. Other embodiments are disclosed.

32 Claims, 7 Drawing Sheets

(58) Field of Classification Search
USPC .......... 379/9.06, 10.01, 15.01, 21, 25, 29.11, 379/319–321, 325–332, 334
See application file for complete search history.

(56) References Cited

U.S. PATENT DOCUMENTS

| | | | |
|---|---|---|---|
| 5,483,467 A | 1/1996 | Krupka et al. |
| 5,550,755 A | 8/1996 | Martin et al. |
| 5,764,043 A | 6/1998 | Czosnowski et al. |
| 5,821,510 A | 10/1998 | Cohen et al. |
| 5,854,824 A | 12/1998 | Bengal et al. |
| 6,002,331 A | 12/1999 | Laor |
| 6,222,908 B1 | 4/2001 | Bartolutti et al. |
| 6,285,293 B1 | 9/2001 | German et al. |
| 6,330,307 B1 | 12/2001 | Bloch et al. |
| 6,350,148 B1 | 2/2002 | Bartolutti et al. |
| 6,424,710 B1 | 7/2002 | Bartolutti et al. |
| 6,522,737 B1 | 2/2003 | Bartolutti et al. |
| 6,532,215 B1 | 3/2003 | Muntz |
| 6,705,707 B2 | 3/2004 | Furukawa |
| 6,725,177 B2 | 4/2004 | David et al. |
| 6,784,802 B1 | 8/2004 | Stanescu |
| 6,961,675 B2 | 11/2005 | David |
| 6,968,994 B1 | 11/2005 | Ashwood Smith |
| 6,985,713 B2 | 1/2006 | Lehr et al. |
| 7,106,071 B2 | 9/2006 | Pham et al. |
| 7,139,668 B2 | 11/2006 | Bechhoefer |
| 7,153,142 B2 | 12/2006 | Shifris et al. |
| 7,160,143 B2 | 1/2007 | David et al. |
| 7,164,274 B2 | 1/2007 | Pham et al. |
| 7,170,393 B2 | 1/2007 | Martin |
| 7,193,422 B2 | 3/2007 | Velleca et al. |
| 7,217,152 B1 | 5/2007 | Xin et al. |
| 7,289,449 B1 | 10/2007 | Rubinstein et al. |
| 7,297,018 B2 | 11/2007 | Caveney et al. |
| 7,370,106 B2 | 5/2008 | Caveney |
| 7,414,410 B2 | 8/2008 | Pham et al. |
| 7,517,243 B2 | 4/2009 | Caveney et al. |
| 7,573,254 B2 | 8/2009 | Cobb et al. |
| 7,664,232 B2 | 2/2010 | Sherman |
| 7,705,606 B2 | 4/2010 | Peyton et al. |
| 7,719,992 B1 | 5/2010 | Gourlay et al. |
| 7,737,704 B2 | 6/2010 | Diab et al. |
| 7,738,387 B2 | 6/2010 | Diab et al. |
| 7,769,090 B2 | 8/2010 | Peleg et al. |
| 8,638,651 B2 | 1/2014 | Michaelis et al. |
| 8,643,476 B2 | 2/2014 | Pinn et al. |
| 8,670,335 B2 | 3/2014 | Barkan et al. |
| 9,678,133 B2 | 6/2017 | Enge |
| 9,742,704 B2 | 8/2017 | Coffey |
| 9,759,884 B2 | 9/2017 | Coffey et al. |
| 2002/0090858 A1 | 7/2002 | Caveney |
| 2004/0021452 A1 | 2/2004 | Hwang et al. |
| 2005/0245127 A1 | 11/2005 | Nordin et al. |
| 2006/0160396 A1 | 7/2006 | Macauley et al. |
| 2006/0164998 A1 | 7/2006 | Pham |
| 2007/0117444 A1 | 5/2007 | Caveney et al. |
| 2007/0243725 A1 | 10/2007 | Nordin et al. |
| 2008/0122579 A1 | 5/2008 | German et al. |
| 2008/0265915 A1 | 10/2008 | Clark et al. |
| 2009/0096581 A1 | 4/2009 | Macauley et al. |
| 2009/0175195 A1 | 7/2009 | Macauley |
| 2009/0178119 A1 | 7/2009 | Macauley |
| 2010/0008482 A1 | 1/2010 | Tucker |
| 2010/0011097 A1 | 1/2010 | Cobb |
| 2010/0085156 A1 | 4/2010 | Tucker |
| 2010/0244998 A1 | 9/2010 | Peyton et al. |
| 2011/0043371 A1* | 2/2011 | German ................ G06F 13/36 340/815.45 |
| 2011/0097925 A1 | 4/2011 | Caveney et al. |
| 2012/0128136 A1 | 5/2012 | German et al. |
| 2015/0334473 A1* | 11/2015 | Pinn ..................... H04Q 1/09 340/691.6 |
| 2019/0041637 A1 | 2/2019 | German et al. |
| 2019/0174650 A1 | 6/2019 | Smith |

OTHER PUBLICATIONS

European Patent Office, "Extended European Search Report from EP Application No. 19161100.3 dated Jun. 25, 2019", from Foreign Counterpart to U.S. Appl. No. 16/293,536, pp. 1-8, Published: EP.

* cited by examiner

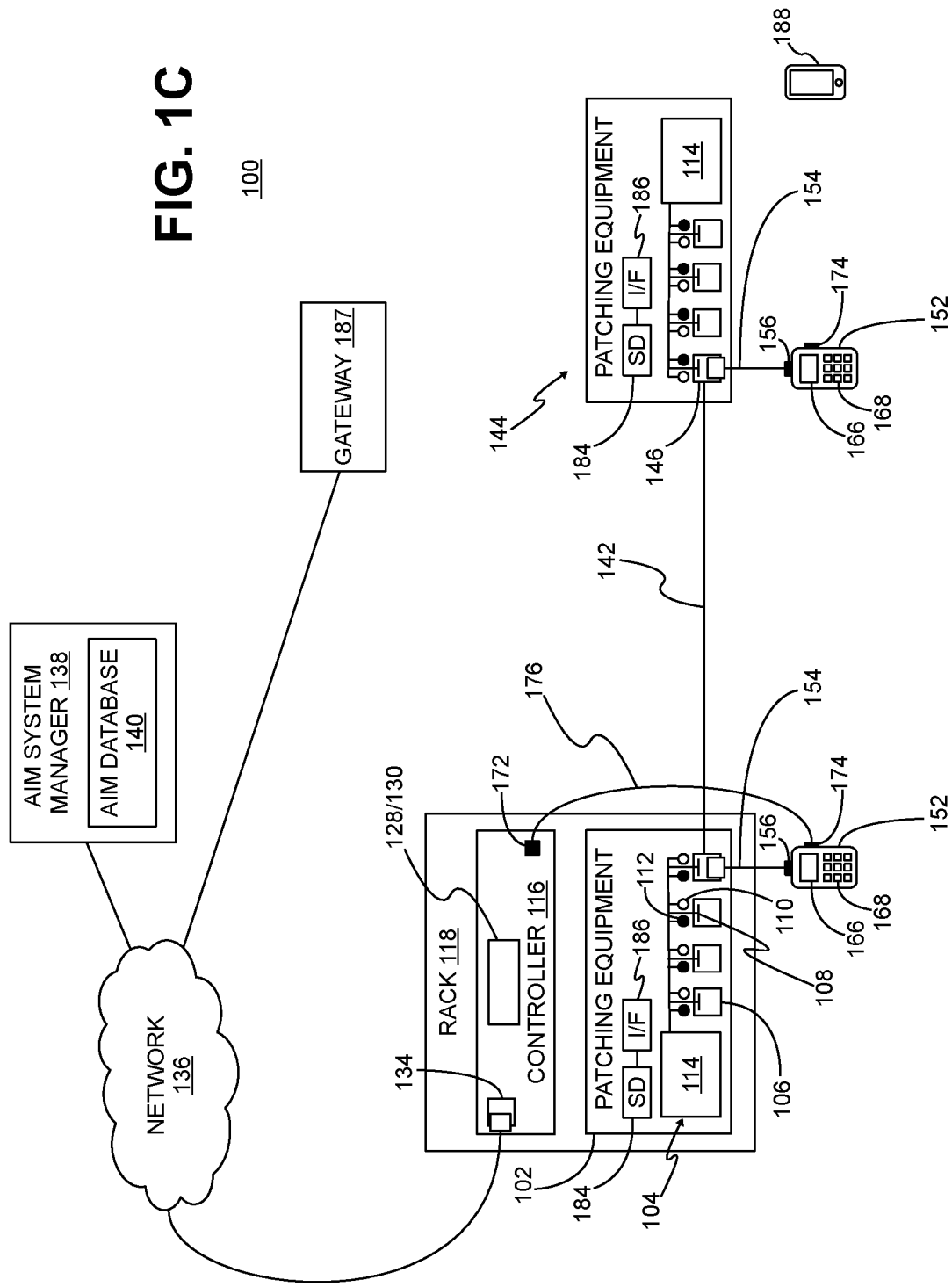

AUTOMATED CAPTURE OF INFORMATION ABOUT FIXED CABLING

CROSS-REFERENCE TO RELATED APPLICATIONS

This application claims the benefit of U.S. Provisional Patent Application No. 62/639,371 filed on Mar. 6, 2018 and titled "AUTOMATED CAPTURE OF INFORMATION ABOUT FIXED CABLING," the contents of which is incorporated herein in its entirety.

BACKGROUND

Automated infrastructure management (AIM) systems are typically used to automatically detect and document changes in patching connections made in a structured cabling system. Such patching connections are typically made by connecting two or more connections points (also referred to here as a "ports") located on the front side of patching equipment. These patching connections are made using patch cords that are connected to the ports.

Typically, each port on the front of an item of patching equipment is connected by the patching equipment to a cable that is terminated at the rear of the patching equipment. Changes to such rear cables typically occur infrequently (for example, when the patching equipment is first installed or during building remodeling). This cabling is also referred to here as "fixed cabling," and the associated connections are also referred to here as "fixed connections." Thus, AIM systems have not historically been configured to automatically detect and document changes to the fixed cabling. As a result, information about the fixed cabling and associated connections have historically been manually captured and supplied to any AIM database.

Typically, information about fixed cabling and connections is captured when the cables are installed. For example, technicians installing such fixed cables and connections can manually capture information about the fixed cables and connections using various devices (for example, cable testers) and manually enter the captured information into a spreadsheet using a portable computer. Later, the spreadsheet can be imported into a database. However, this manual work flow can be inconvenient for the technicians and prone to errors.

Moreover, in order to obtain information about the rear cables and connections, the database to which such information was supplied must be queried.

DRAWINGS

FIGS. 1A-1C are block diagrams of exemplary embodiments of an automated infrastructure management (AIM) system.

Figure 2:
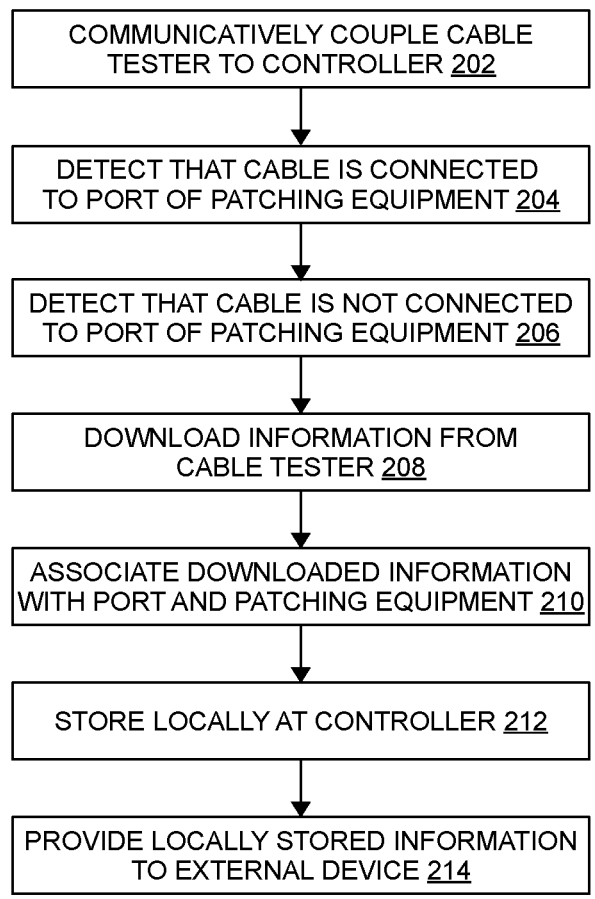

FIG. 2 comprises a high-level flow chart illustrating one exemplary embodiment of a method of automatically capturing information about fixed cabling.

Figure 3:
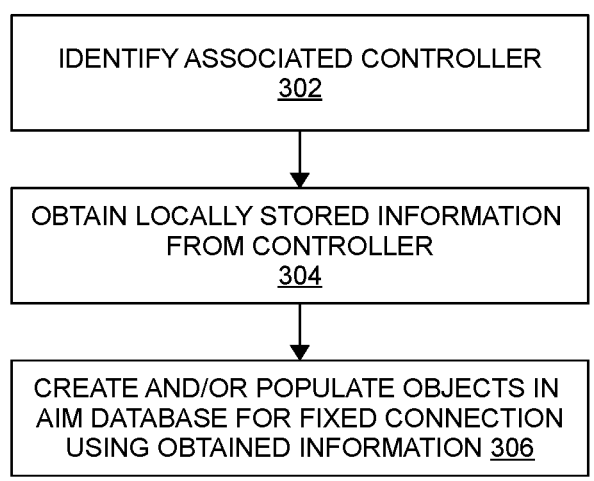

FIG. 3 comprises a high-level flow chart illustrating one exemplary embodiment of a method of automatically creating and/or populating objects associated with fixed cabling.

Figure 4:
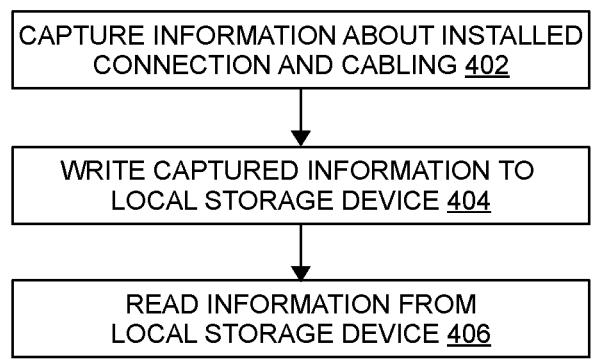

FIG. 4 comprises a high-level flow chart illustrating one exemplary embodiment of a method of locally storing information about fixed cabling.

Like reference numbers and designations in the various drawings indicate like elements.

DETAILED DESCRIPTION

Figure 1A:
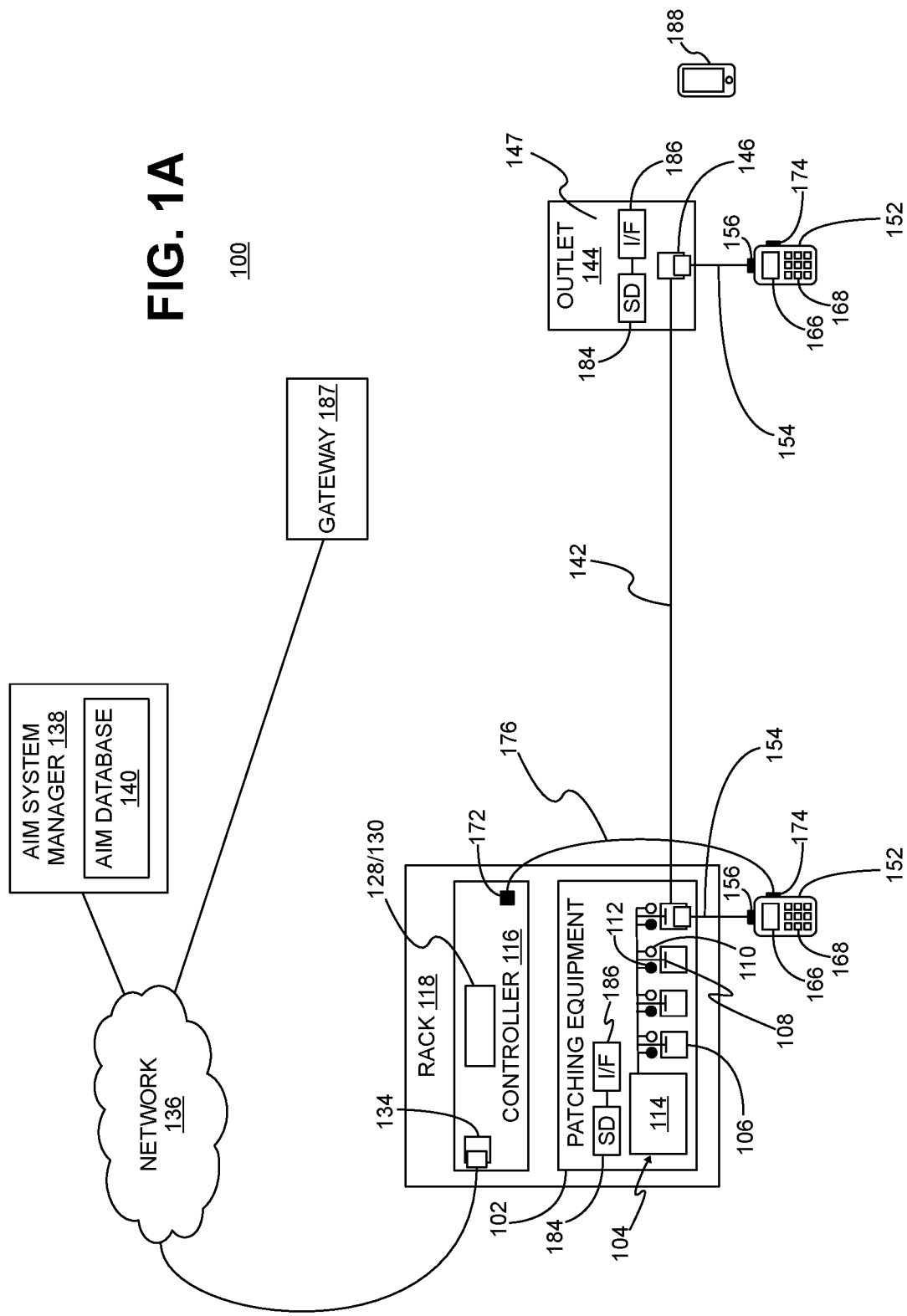

FIG. 1A is a block diagram of one exemplary embodiment of an automated infrastructure management (AIM) system 100 that is configured to track connections made using items of patching equipment 102. The connections can be made with various types of cabling, including, without limitation, copper cables and fiber optic cables.

The system 100 shown in FIG. 1A can be implemented in a data center or enterprise application. Other embodiments can be implemented in other ways (for example, where the system 100 is implemented in a central office or other facility of a telecommunication service provider and/or in another part of the telecommunication service provider's network).

The patching equipment 102 is deployed in racks along with other items of equipment (not shown) (such as servers, routers, and switches). The AIM system 100 is configured to track connections made at the patching equipment 102 as well as connections with the other equipment.

In one aspect illustrated in FIG. 1A, the AIM system 100 is configured to work with patching equipment 102 (such as patch panels) that has AIM functionality 104 for tracking connections made at the ports 106 located on the front (or patching) side of the patching equipment 102. This patching equipment 102 is also referred to here as "intelligent patching equipment" 102. In the example shown in FIG. 1A, the patching equipment 102 is shown as having four ports 106; however, it is to be understood that this is for the purposes of illustration and that the patching equipment 102 can include a different number of ports 106.

In one aspect illustrated in FIG. 1A, for each port 106 of the associated item of patching equipment 102, the AIM functionality 104 comprises a sensor, reader, interface, or other circuitry (collectively referred to here as a "sensor") 108 for use in determining the presence of, and/or information from or about, a connector and/or cable attached to the associated port 106. In one aspect, for each port 106 of the associated item of intelligent patching equipment 102, the AIM functionality 104 further comprises one or more visual indicators 110 (such as one or more light emitting diodes (LEDs)) for providing a visual indication to a user, for example, to enable the user to visually identify that particular port 106. In one aspect, for each port 106 of the associated item of intelligent patching equipment 102, the AIM functionality 104 also comprises a respective user-input device 112 (such as a button) by which a user is able to select that port 106.

The AIM functionality 104 can be implemented in many different ways and the particular configuration illustrated in FIG. 1A is merely exemplary and should not be construed as limiting. Each sensor 108, visual indicator 110, or user-input device 112 can be associated with a single port 106 or can be associated with multiple ports 106 (for example, these items can be associated with all of the ports 106 or with a subset of ports 106 such as a row or other grouping of ports 106).

Various types of AIM technology can be used. One type of AIM technology infers connection information by sensing when connectors are inserted or removed from ports. Another type of AIM technology makes use of so-called "ninth wire" or "tenth wire" technology. Ninth wire/tenth wire technology makes use of special cables that include one or more extra conductors or signal paths that are used for determining which port each end of the cable is inserted into. Yet another type of AIM technology makes use of an Electrically Erasable Programmable Read-Only Memory (EEPROM) or other storage device that is integrated with or attached to a connector on a cable. The storage device is used to store an identifier for the cable or connector along with other information. The port (or other connector) into which the associated connector is inserted is configured to read the information stored in the EEPROM when the connector is inserted into the front side of a port of a patch panel or other item of patching equipment. A similar approach can be used with optical machine-readable representations of data (such as barcodes or QR codes).

Another type of AIM technology makes use of radio frequency identification (RFID) tags and readers. With RFID technology, an RFID tag is attached to or integrated with a connector on a cable. The RFID tag is used to store an identifier for the cable or connector along with other information. The RFID tag is typically then read using an RFID reader after the associated connector is inserted into a port (or other connector) of a patch panel or other item of patching equipment.

Other types of AIM technology can be used.

In one aspect illustrated in FIG. 1A, each item of intelligent patching equipment 102 includes a respective programmable processor 114 that is communicatively coupled to the other AIM functionality 104 in that item of patching equipment 102. The programmable processor 114 is configured to execute software that reads or otherwise receives information from each sensor 108, controls the state of each visual indicator 110, and determines the state of each button 112.

The sensor 108, visual indicator 110, button 112, and processor 114 can be natively integrated into the patching equipment 102 or can be packaged into a retrofit kit that can be installed on already deployed patching equipment 102.

The AIM system 100 further comprises one or more controllers 116. In the exemplary embodiment shown in FIG. 1A, the controller 116 is implemented as a unit that is separate from the patching equipment 102 such that one controller 116 is able to serve multiple items of patching equipment 102. It is to be understood, however, that other embodiments can be implemented in other ways. For example, one or more items of patching equipment 102 can have a controller 116 integrated within the patching equipment 102 so that the controller 116 is a part of the patching equipment 102 instead of being separate therefrom.

In the exemplary embodiment shown in FIG. 1A, each controller 116 is configured to be connected to, and manage, patching equipment 102 having AIM functionality 104 that is installed in one or more racks 118 and is also referred here as a "rack controller 116."

Each rack controller 116 aggregates connection information for the ports 106 of the patching equipment 102 in the associated racks 118. More specifically, each rack controller 116 is configured to use the sensor 108 associated with each port 106 of the patching equipment 102 mounted in the associated rack 118 to monitor the state of each port 106 and identify connection or disconnection events occurring at that port 106 (for example, by detecting changes in the connection state of the port 106). Also, each rack controller 116 is configured to illuminate or otherwise actuate any visual indicators 110 associated with the port 106 and to monitor the state of each button 112 associated with that port 106 and identify any events occurring at such buttons 112 (for example, button press and/or release events).

Figure 1B:
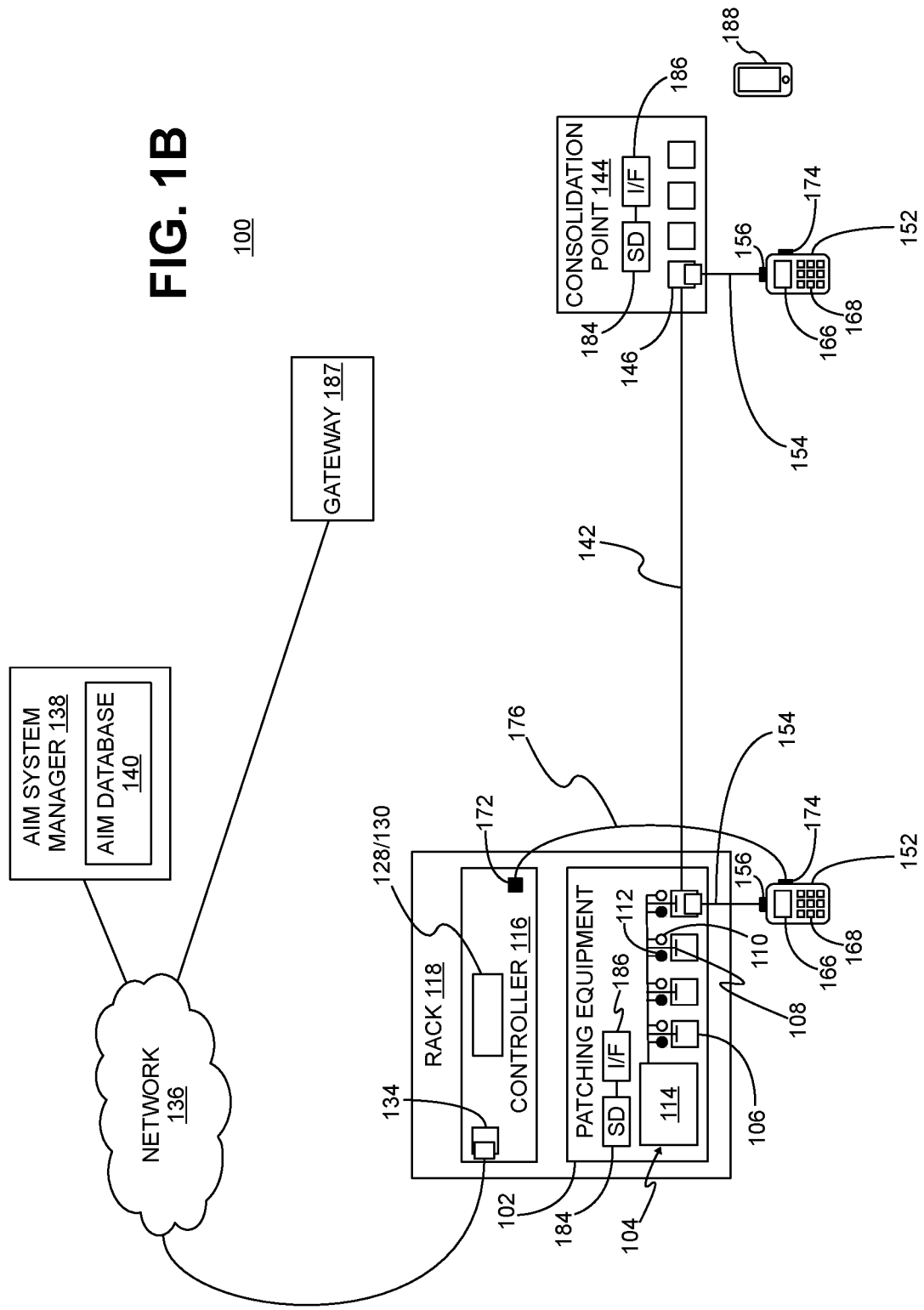
Figure 1E:
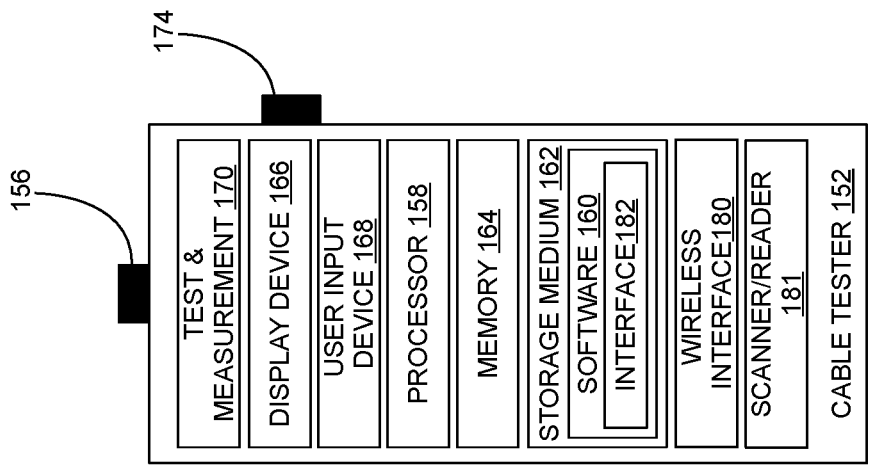
FIG. 1E is a block diagram of one exemplary embodiment of a cable tester suitable for use in the systems of FIGS. 1A-1C.
Figure 1D:
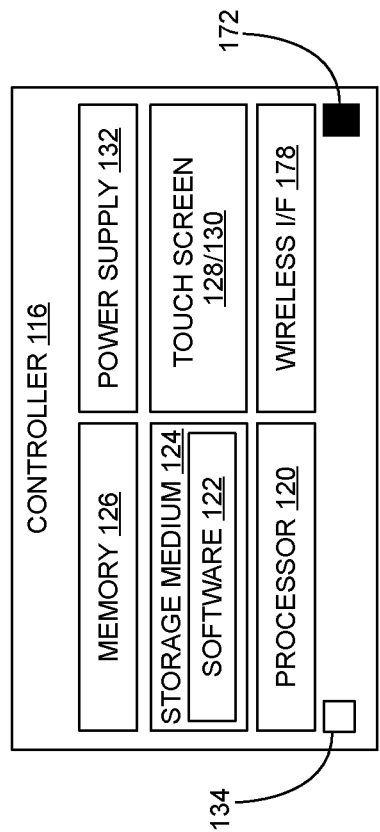
FIG. 1D is a block diagram of one exemplary embodiment of a controller suitable for use in the systems of FIGS. 1A-1C.

One exemplary embodiment of a controller 116 is shown in FIG. 1D. In one aspect illustrated in FIG. 1D, each rack controller 116 comprises at least one programmable processor 120 on which software or firmware 122 executes. The software 122 comprises program instructions that are stored (or otherwise embodied) on an appropriate non-transitory storage medium or media 124 from which at least a portion of the program instructions are read by the programmable processor 120 for execution thereby. The software 122 is configured to cause the processor 120 to carry out at least some of the operations described here as being performed by that controller 116. Although the storage medium 124 is shown in FIG. 1D as being included in the controller 116, it is to be understood that remote storage media (for example, storage media that is accessible over a network) and/or removable media can also be used. In one aspect illustrated in FIG. 1D, each rack controller 116 also comprises memory 126 for storing the program instructions and any related data during execution of the software 122.

Each rack controller 116 also includes a display device 128 for displaying information for a user located at the associated rack 118 and a user-input device 130 for receiving user-input from such a user. In one aspect illustrated in FIG. 1D, the display device 128 and the user-input device 130 are implemented together in a liquid crystal display (LCD) touch screen that is used for both displaying information and receiving user input.

Each rack controller 116 includes a power supply 132 that is configured to provide power for rack controller 116 and the patching equipment 102 connected to the rack controller 116. In other embodiments, the power supply 132 is implemented separately from the controller 116.

In this embodiment, each rack controller 116 comprises an external network interface 134 that can be used to directly connect that rack controller 116 to an external network 136 (shown in FIG. 1A). In this exemplary embodiment, the external network 136 is implemented as an ETHERNET LAN and, as a result, the external network interface 134 comprises an ETHERNET interface and is also referred to here as "ETHERNET interface" 134.

As shown in FIG. 1A, each rack controller 116 provides asset and connection information to an AIM system manager 138. In one aspect, the AIM system manager 138 is configured to compile asset and connection information and to provide an end-to-end trace of connections. The AIM system manager 138 stores the asset and connection information in an AIM database 140. The AIM system manager 138 and AIM database 140 can be implemented using one or more computers on which appropriate software is executed.

As shown in FIG. 1A, in this exemplary embodiment, for at least some of the patching equipment 102, fixed cables 142 are connected to the rear of the patching equipment 102 (for example, using punch-down blocks). The patching equipment 102 is configured so that each port 106 on the front of the patching equipment 102 is connected to at least one fixed cable 142 in order to establish a communication path between that port 106 and the at least one fixed cable 142.

The other end of each fixed cable 142 is terminated at another item of equipment (referred to here generally as "other equipment" 144). In the example shown in FIG. 1A, the other equipment 144 comprises a wall outlet that is deployed in the worked area. The other end of the fixed cabling 142 can be coupled to other types of equipment. That is, the "other equipment" 144 referred to here can comprise other types of equipment. For example, as shown in FIG. 1B, the other equipment 144 can comprise a consolidation point 144 or, as shown in FIG. 1C, the other equipment 144 can comprises another item of patching equipment (referenced in this context with reference numeral 144). Also, for ease of explanation, only a single fixed cable 142 and item of other equipment 144 is shown in FIGS. 1A-1C; however, it is to be understood that multiple fixed cables 142 and items of other equipment 144 (and multiple types of other equipment 144) can and typically would be used.

Each item of other equipment 144 typically includes one or more ports 146. For example, where the other equipment 144 is a wall outlet as shown in FIG. 1A, the wall outlet 144 includes one or more ports 146 on the front of the outlet 144. In example shown in FIG. 1A, the outlet 144 is shown as having one port 146; however, it is to be understood that this is for the ease of illustration and that the outlet 144 can include a different number of ports 146. In the example shown in FIG. 1A, each outlet 144 can also comprise a faceplate 147 to which the ports 146 are mounted. The outlets 144 can be implemented in other ways.

Where the other item of equipment 144 is a consolidation point, the consolidation point 144 includes multiple ports 146 where respective fixed cables 142 can be terminated at the rear of the ports 146 and other cables can be connected to the front of the ports 146, where each of those other cables can be terminated at its other end in the work area (for example, at a wall outlet). Where the other item of equipment 144 is another item of patching equipment, that other item of patching equipment (referenced in this context with reference numeral 144) is implemented as described above and also includes multiple ports (referenced in this context with reference numeral 146) where the relevant fixed cable 142 can be terminated at the rear of one of the ports 146 and other cables can be connected to the front of that port 146.

In the exemplary embodiments described here, the patching equipment 102 does not include any sensors to automatically detect when a cable is connected to the rear (non-patching side) of the patching equipment 102. For example, there is no sensor to automatically detect when a fixed cable 142 has been connected to the rear of an item of patching equipment 102.

Each connection between a port 106 of patching equipment and a port 146 of the other item of equipment 144 (which includes the fixed cable 142) is tested by two technicians using a respective cable tester 152. One technician is located near the patching equipment 102, and the second technician is located near the item of other equipment 144. Among other things, the technicians use the cable testers 152 to verify the transmission performance requirements for the connection (for example, by verifying that the requirements specified in TIA/EIA TSB-67 are met). The technicians also verify that each such connection has been correctly established and labeled at the specified port 106 of the patching equipment 102 and at the specified port 146 of the item of other equipment 144.

Each cable tester 152 is configured so that one end of a probe cable 154 can be attached to a probe port 156 of the cable tester 152. In the case of the cable tester 152 used by the technician located near the patching equipment 102, the other end of the probe cable 154 can be connected to a port 106 of the patching equipment 102. In the case of the technician that is located near the item of other equipment 144, the other end of the probe cable 154 can be connected to a port 146 of that other equipment 144.

Each cable testers 152 also comprises at least one programmable processor 158 on which software or firmware 160 executes. The software 160 comprises program instructions that are stored (or otherwise embodied) on an appropriate non-transitory storage medium or media 162 from which at least a portion of the program instructions are read by the programmable processor 158 for execution thereby. The software 160 is configured to cause the processor 158 to carry out at least some of the operations described here as being performed by that cable tester 152. Although each storage medium 162 is shown in FIG. 1E as being included in the cable tester 152, it is to be understood that remote storage media (for example, storage media that is accessible over a network) and/or removable media can also be used. In one aspect illustrated in FIG. 1E, each cable tester 152 also comprises memory 164 for storing the program instructions and any related data during execution of the software 160.

In this exemplary embodiment, each cable tester 152 also includes a display device 166 for displaying information for a user and a user-input device 168 for receiving user input from such a user. In one aspect illustrated in FIG. 1E, each display device 166 is implemented using a LCD display, and each user-input device 68 is implemented using a keypad. In other aspects, the display device 166 and the user-input device 168 for each cable tester 152 are implemented together in a liquid crystal display (LCD) touch screen that is used for both displaying information and receiving user input.

Each cable tester 152 also includes test and measurement circuitry 170 that is configured to (under the control of the programmable processor 158 and software 160 executing thereon) transmit and receive testing and measurement signals over the probe cable 154. For example, in one embodiment, the test and measurement circuitry 170 and programmable processor 158 (and software 160 executing thereon) are configured to test, measure, and/or otherwise determine the following about the associated connection: connectivity, length, attenuation, wire map, near-end crosstalk (NEXT), impedance, capacitance, resistance, delay, delay skew, equal level far-end crosstalk (ELFEXT), and attenuation-to-crosstalk ratio (ACR). Where optical cables are to be tested, the test and measurement circuitry 170 and programmable processor 158 (and software 160 executing thereon) can be configured to test, measure, and/or otherwise determine the following about the associated connection: fiber type, insertion loss, measured loss at 850 nanometers (nm), limit loss at 850 nm, margin loss at 850 nm, measured loss at 1300 nm, limit loss at 1300 nm, and margin loss at 1300 nm. In other embodiments, the test and measurement circuitry 170 is configured in other ways.

Historically, any data that would be captured during such cable tester verification processes would be manually captured (for example, in spreadsheet file) and manually entered or imported into an AIM database 140 at a later point in time. However, this work flow can be error prone and inconvenient for the technicians.

To address these issues, in this exemplary embodiment, the rack controller 116 is configured to automatically retrieve data that is collected by a cable tester 152 and to automatically associate such data with the appropriate ports 106 and 146 and patching equipment 102 and other equipment 144. Also, the rack controller 116 is configured to locally store data collected by a cable tester 152 and data indicating which ports 106 and 146 and patching equipment 102 and other equipment 144 are associated with. This data can be retrieved by the AIM system manager 138 and used to create and/or populate appropriate objects in the AIM database 140.

In order to do this, a cable tester 152 is communicatively coupled to the rack controller 116. This can be done using a wired connection. For example, in this embodiment, the rack controller 116 includes a Universal Serial Bus (USB) interface 172, and the cable tester 152 includes a USB interface 174. Then, a wired connection can be established between the rack controller 116 and the cable tester 152 by attaching one end of USB cable 176 to the USB interface 172 of the rack controller 116 and the other end of the USB cable 176 to the USB interface 174 of the cable tester 152. The cable tester 152 can be communicatively coupled to the rack controller 116 using a wireless connection. For example, in this embodiment, the rack controller 116 includes a wireless interface 178, and the cable tester 152 includes a wireless interface 180. Then, a wireless connection can be established between the rack controller 116 and the cable tester 152 using the wireless interfaces 178 and 180. This can be done using a wireless local area network, in which case the wireless interfaces 178 and 180 are configured to implement the appropriate wireless local area network interfaces and protocols (for example, one or more of the Institute of Electrical and Electronics Engineers (IEEE) 802.11 family of wireless local area network protocols). This can be done using a different wireless protocol (for example, by using one or more of the BLUETOOTH family of wireless protocols).

Also, in this embodiment, the software 160 executing on the cable tester 152 implements an interface 182 (shown in FIG. 1E) that the software 122 executing on the rack controller 116 is able to use to request that the cable tester 152 provide information to the rack controller 116. This information can include information that the cable tester 152 has received, measured, or otherwise obtained. In response to such a request, the interface 182 implemented in the software 160 executing on the cable tester 152 provides the requested information to the rack controller 116 over the connection that is established between the cable tester 152 and the rack controller 116.

Moreover, in the exemplary embodiment shown in FIG. 1A-1C, at least some of the patching equipment 102 and the other equipment 144 include storage devices 184 in which information can be stored locally. Each such storage device 184 includes, or is coupled to, an associated wireless interface 186 by which information can be written to the associated storage device 184 and by which information stored in the associated storage device 184 can be read. A portable device (for example, a cable tester 152 or a smartphone or tablet 188) near the patching equipment 102 or other equipment 144 can be used to read and write data from and to the storage device 184 using the wireless interface 186.

An item of patching equipment 102 or other equipment 144 can include a single storage device 184 and wireless interface 186 regardless of the number of ports 106 or 146 included in the patching equipment 102 or other equipment 144. Also, an item of patching equipment 102 or other equipment 144 can include multiple storage devices 184—for example, where a separate storage device 184 is provided for each port 106 or 146 or where a separate storage device 184 is provided for each subset (such as a row or other grouping) of ports 106 or 146. Moreover, an item of patching equipment 102 or other equipment 144 can include multiple wireless interface 186—for example, where a separate wireless interface 186 is provided for each storage device 184 or where a separate storage device 184 is provided for each subset of storage devices 184.

In one example, information related to the fixed cable 142 coupled to each port 106 and port 146 can be written to the associated storage device 184 during installation or when any changes are made to the cable 142. Thereafter, information about that cabling 142 can be read using a portable device (such as a smartphone or tablet 188). Other data can be written to and read from the storage devices 184.

Each storage device 184 and wireless interface 186 can be implemented using near-field communication (NFC) technology. In such an implementation, power for each storage device 184 and wireless interface 186 can be provided by the portable device using the NFC technology. In this way, data can be written to and read from each storage device 184 even if power is not otherwise being provided to the patching equipment 102 or the other equipment 144. Wall outlets and consolidation points are typically passive devices and are not otherwise powered.

Moreover, although the patching equipment 102 shown in FIGS. 1A-1C is typically provided power (for example, from the rack controller 116 or a power supply installed with the rack controller 116), there are situations where power is not being provided to the patching equipment 102. This can occur, for example, during the initial installation of the AIM system 100 or during major changes to the AIM system 100. In these situations, a technician using a cable tester 152 or other portable device is still able to write information to and read information from the storage devices 184.

In this way, information about the installed connection and fixed cabling can be locally stored in storage device 184 associated with, and local to, the relevant ports and thereafter, at an appropriate and convenient time, read by a portable device (such as a smartphone or table 188) that is near one of the relevant ports. This can be done to obtain information about the port and the associated connection and fixed cabling without having to access the AIM system 138 and AIM database 140. This is useful in situations where the AIM system 138 has not been configured and/or where the AIM database 140 has not been created or populated. This is also useful in situations where the AIM system 138 and the AIM database 140 are not available or accessible.

In other embodiments, each storage device 184 and wireless interface 186 can be implemented so as to be powered using at least one of a battery, a solar cell, or mains or grid power.

Also, each storage device 184 and wireless interface 186 in some of the patching equipment 102 or other equipment 144 can be configured to transmit a beacon that includes at least some of the information stored in the storage device 184. Moreover, each storage device 184 and wireless interface 186 can be configured to join a mesh network (including, for example, other similarly configured patching equipment 102 or other equipment 144 and a gateway 187 connected to an external network 136) to enable a remote external device to write information to and read information from the storage device 184 using the wireless interface 186. For example, the AIM manager 138 can access information stored in the storage device 184 via the gateway 187 and the mesh network. A suitable mesh networking protocol can be used (for example, BLUETOOTH LOW ENERGY).

FIG. 2 comprises a high-level flow chart illustrating one exemplary embodiment of a method 200 of automatically capturing information about fixed cabling. The embodiment of method 200 shown in FIG. 2 is described here as being implemented using the AIM system 100 of FIG. 1A, though it is to be understood that other embodiments can be implemented in other ways.

The blocks of the flow diagram shown in FIG. 2 have been arranged in a generally sequential manner for ease of explanation; however, it is to be understood that this arrangement is merely exemplary, and it should be recognized that the processing associated with method 200 (and the blocks shown in FIG. 2) can occur in a different order (for example, where at least some of the processing associated with the blocks is performed in parallel and/or in an event-driven manner). Also, most standard exception handling is not described for ease of explanation; however, it is to be understood that method 200 can and typically would include such exception handling.

Method 200 comprises communicatively coupling a cable tester 152 to the controller 116 (block 202). This can be done by establishing a wired or wireless connection between a cable tester 152 and the controller 116.

In one implementation of the method 200 shown in FIG. 2, the controller 116 will automatically discover that a cable tester 152 has been communicatively coupled to it and, in response, enter a special mode (referred to here as "cable tester mode") in which the controller 116 interacts with the cable tester 152.

In another implementation, the technician using the cable tester 152 interacts with the display device 128 and user-input device 130 of the controller 116 in order to inform the rack controller software 122 that the cable tester 152 has been coupled to it and to place the controller 116 into cable tester mode.

In any case, the controller software 122 can be configured to display a message on the display devices 128 of the controller 116 indicating that the rack controller 116 is in cable tester mode.

Method 200 further comprises detecting, by the controller 116 while operating in the cable tester mode, the connection of a cable to a port 106 of an item of patching equipment 102 that is within the domain of the controller 116 (block 204). As noted above, each item of patching equipment 102 includes AIM functionality 104 that comprises sensors 108 for detecting if a cable is connected the connection and disconnection of cables to and from ports 106 of patching equipment 102 within the domain of the controller 116. In general, a connection event can be considered to have occurred when a port 106 that was previously in an "empty" or "disconnected" state (that is, a state in which no cable is connected to the associated port 106) changes to a "connected" state (that is, a state in which a cable is connected to the associated port 106). Likewise, a disconnection event can be considered to have occurred when a port 106 that was previously in the connected state changes to the disconnected state.

The particular port 106 and associated item of patching equipment 102 where the controller 116 has determined that the detected connection event occurred are referred to here as the "identified port 106" and the "identified patching equipment 102."

In this exemplary embodiment, while the rack controller 116 is put into cable tester mode, two technicians install a connection between an item of patching equipment 102 and other equipment 144 (such as a wall outlet, consolidation point, or other item of patching equipment). The connection includes a fixed cable 142. The connection is terminated at the rear (or non-patching) side of the patching equipment 102 and at the rear of the other equipment 144 and is coupled, by the patching equipment 102 and the other equipment 144, respectively, to the port 106 and 146 on the front (or patching) side. In connection with doing this, the technicians use cable testers 152 to test and verify the installed connection.

In this exemplary embodiment, the rack controller 116 is configured to assume that, while operating in cable tester mode, any detected connection event is the result of a technician connecting a probe cable 154 to the identified port 106, where the other end of the probe cable 154 is tethered to a cable tester 152 being used by that technician.

In this exemplary embodiment, the cable testers 152 are configured to receive identification and/or location information associated with the connection (and associated fixed cabling) that is being tested. For example, this identification information can include identifiers assigned to the cabling (referred to here as "cable identifiers" or "cable IDs"), to the ports 106 and 146 of the patching equipment 102 and other equipment 144 (also referred to here as "port identifiers" or "port IDs"), the patching equipment 102 and other equipment 144 themselves (also referred to here "patching equipment identifiers" or "patching equipment IDs" and "outlet identifiers" or "outlet IDs", respectively). This identification information can also include an identifier assigned to a bundle of cables used for providing Power-Over-Ethernet (POE) service to devices (also referred to here as a "bundle identifier" or "bundle ID"). Standards and specifications, such as those promulgated by the Telecommunications Industry Associations (TIA), include guidance regarding providing POE service over a bundle of cables (including recommendations regarding the maximum temperature rise).

The location information can include a building, floor, room, row, rack, or indoor coordinates where any of the following are located: a port 106, an item of patching equipment 102, an end of a cable, or an end of a connection implemented using a cable. The location information for a port 106, cable, or connection can also include a name, identifier, or other information associated with any of the following: a second port to which the port 106, cable, or connection is also connected and the equipment (such as an item of patching equipment, outlet, or other equipment such as a server, switch, or router) of which the second port is a part.

The software 160 executing on the cable tester 152 can be configured to prompt the technician to enter such information (for example, by displaying a message on the display device 166 of the cable tester 152). In response, the technician enters the information (for example, using the user input device 168 of the cable tester 152) and the software 160 executing on the cable tester 152 is configured to receive and store the entered information.

Another way that the cable tester 152 can receive such information is by receiving such information from a network. For example, identifier information to be downloaded to the cable tester 152 can be entered using a computer, and then the entered information can be downloaded to the cable tester 152 (for example, over a wired or wireless connection established with the cable tester 152).

Another way that the cable tester 152 can receive such information is by scanning a bar or QR code or reading an RFID tag that encodes or stores identification and/or location information for an item (such as a cable, connector, port, item of patching equipment, shelf, rack, row, room, floor, building, etc.) to which it is attached or in which it is located. In such an example, the cable tester 152 includes an appropriate optical scanner or RFID reader 181 (shown in FIG. 1E) and software therefor.

The cable testers 152 can receive the identifier information before or after the probe cable 154 is connected to the identified port 106.

The cable testers 152 are also used to test, measure, and/or otherwise determine various aspects of the installed connection associated with the identified port 106. The information determined in connection with performing this testing is referred to here generally as "testing information." This testing information can include information about one or more of the following about the fixed cabling being tested: connectivity, length, attenuation, wire map, near-end crosstalk (NEXT), impedance, capacitance, resistance, delay, delay skew, equal level far-end crosstalk (ELFEXT), and attenuation-to-crosstalk ratio (ACR). Where optical cables are to be tested, this testing information can include information about one or more of the following about the fixed cabling being tested: fiber type, insertion loss, measured loss at 850 nanometers (nm), limit loss at 850 nm, margin loss at 850 nm, measured loss at 1300 nm, limit loss at 1300 nm, and margin loss at 1300 nm. This testing information can also include the date or time when the testing was performed.

Method 200 further comprises detecting, by the rack controller 116 while operating in the cable tester mode, that a cable is no longer connected to the identified port 106 of the identified item of patching equipment 102 (block 206). That is, the controller 116 is configured to detect when the cable is disconnected from the identified port 106 and this can be done, for example, by determining when a port 106 that previously had a cable connected to it no longer has a cable connected to it. Such disconnection events can be determined in other ways.

In this exemplary embodiment, the probe cable 154 connected to the identified port 106 is disconnected from (that is, is no longer connected to) the port 106 after the associated fixed connection (and associated fixed cable 142) has been installed and tested and verified by the two technicians using the cable testers 152.

In this exemplary embodiment, the rack controller 116 is configured to assume that, while operating in cable tester mode and after a connection event has been detected at the identified port 106 and identified item of patching equipment 102, any disconnection event detected at the identified port 106 and identified item of patching equipment 102 is the result of a technician disconnecting the probe cable 154 from the identified port 106 after completing the installation, testing, and verification of the connection.

Method 200 further comprises, in response to detecting that a cable has been connected to, and thereafter disconnected from, the identified port 106 of the identified item of patching equipment 102, downloading, from the cable tester 152, information that relates to the connection and cabling associated with that identified port 106 (block 208).

In this embodiment, the software 160 executing on the cable tester 152 implements an interface 182 that the software 122 executing on the rack controller 116 is able to use to request that the cable tester 152 provide information to the rack controller 116 for the most-recently tested connection and cabling. In response to such a request, the software 160 executing on the cable tester 152 provides the requested information to the rack controller 116 over the connection that is established between the cable tester 152 and the rack controller 116.

This information includes at least some of the identifier information received by the cable tester 152 and at least some of the testing information determined by the cable testers 152 as a part of the testing and verification process performed by the technicians for the installed connected associated with the identified port 106.

Method 200 further comprises associating, by the rack controller 116, information provided to it from the cable tester 152 with the identified port 106 and identified item of patching equipment 102 (block 210) and storing, locally at the rack controller 116, the provided information and information about such associations (block 212). That is, the rack controller 116 is configured to associate the identified port 106 and identified item of patching equipment 102 with the information provided from the cable tester 152 in response to the request sent from the rack controller 116 to that cable tester 152. Then, the rack controller 116 locally stores that information at the rack controller 116.

Method 200 further comprises providing at least some of the locally stored information from the controller 116 to an external device (block 214). The information can be provided in response to a request from the external device. One example of how this can be done is shown in FIG. 3.

FIG. 3 comprises a high-level flow chart illustrating one exemplary embodiment of a method 300 of automatically creating and/or populating objects associated with fixed cabling. The embodiment of method 300 shown in FIG. 3 is described here as being implemented using the AIM system 100 of FIG. 1A. More specifically, the processing associated with method 300 can be performed by the AIM system manager 138. It is to be understood, however, that other embodiments can be implemented in other ways.

The blocks of the flow diagram shown in FIG. 3 have been arranged in a generally sequential manner for ease of explanation; however, it is to be understood that this arrangement is merely exemplary, and it should be recognized that the processing associated with method 300 (and the blocks shown in FIG. 3) can occur in a different order (for example, where at least some of the processing associated with the blocks is performed in parallel and/or in an event-driven manner). Also, most standard exception handling is not described for ease of explanation; however, it is to be understood that method 300 can and typically would include such exception handling.

The embodiment of method 300 shown in FIG. 3 is described here as being performed after two technicians have installed a connection between a port 106 of an item of patching equipment and a port 146 of other equipment 144 (which includes a fixed cable 142) and have verified and tested the installed connection using cable testers 152, and the corresponding controller 116 has associated information provided to it from the cable tester 152 with the port 106 and patching equipment 102 and locally stores the such information.

The embodiment of method 300 shown in FIG. 3 can be performed for each port 106 of an item of patching equipment 102 after the installation of fixed cabling has occurred. This can occur, for example, in connection with the initial installation of the patching equipment 102. This can also occur when a new outlet (or other item of equipment) is deployed for connection to a port 106 of previously installed patching equipment 102 (for example, in connection with an office renovation). The embodiment of method 300 shown in FIG. 3 can be performed in other situations.

Method 300 can be can be performed any time after the connection and associated cabling have been installed and tested and the related information has been captured and locally stored at the controller 116.

Also, in the following description of method 300, the particular port 106 and patching equipment 102 for which method 300 is performed are referred to here as the "current port 102" and the "current patching equipment 102," respectively.

Method 300 comprises identifying the associated controller 116 for the current port 106 and current patching equipment 102 (block 302). Typically, the AIM system manager 138 maintains a mapping of each item of patching equipment 102 to the corresponding controller 116 that manages that item, as well as a mapping of each port 106 to the corresponding patching equipment 102 of which it is a part. In such an example, the AIM system manager 138 determines which controller 116 is associated with a given port 106 by first determining which item of patching equipment 102 that port 106 is a part of using the mappings of ports 106 to patching equipment 102. Then, the AIM system manager 138 determines which controller 116 is associated with that item of patching equipment 102 using the mappings of patching equipment 102 to controllers 116. These mappings can be stored, for example, in the AIM database 140.

Method 300 comprises obtaining locally stored information from the identified controller 116 (block 304). For example, the AIM system manager 138 can communicate with the identified controller 116 over the network 136 and request that the controller 116 read, and provide to it, at least some of the information locally stored at the controller 116. In response to such a request, the controller 116 reads, and provides to the AIM system manager 138, the requested information. This information can include the identifier, location, and/or testing information associated with the current port 106 and current patching equipment 102. This information can also include information about other items used to implement the fixed connection such as the associated other port 146 and other equipment 144, and the cabling used to create the associated fixed connection (including the fixed cable 142).

Method 300 further comprises creating and/or populating objects in the AIM database 140 for the associated fixed connection using the provided information (block 306). The information provided from the controller 116 to the AIM system manager 138 can be used to create and/or populate database objects associated with the current port 106, current patching equipment 102, as well as the associated other port 146 and other equipment 144, and the cabling used to create the associated connection (including the fixed cable 142). This information can also be used to create and/or populate other database objects, such as database objects associated with a chassis, rack, floor, room, or building in which the patching equipment 102, other equipment 144, and connection are installed.

With methods 200 and 300, information about an installed connection and fixed cabling (and the port and equipment associations related thereto) can be automatically captured and locally stored by the rack controller 116 and thereafter, at an appropriate and convenient time, used for creating and/or populating objects of the AIM database 140. This can be used to avoid the inconvenient and error-prone manual data entry process.

FIG. 4 comprises a high-level flow chart illustrating one exemplary embodiment of a method 400 of locally storing information about fixed cabling. The embodiment of method 400 shown in FIG. 4 is described here as being implemented using the AIM system 100 of FIG. 1A, though it is to be understood that other embodiments can be implemented in other ways.

The blocks of the flow diagram shown in FIG. 4 have been arranged in a generally sequential manner for ease of explanation; however, it is to be understood that this arrangement is merely exemplary, and it should be recognized that the processing associated with method 400 (and the blocks shown in FIG. 4) can occur in a different order (for example, where at least some of the processing associated with the blocks is performed in parallel and/or in an event-driven manner). Also, most standard exception handling is not described for ease of explanation; however, it is to be understood that method 400 can and typically would include such exception handling.

The embodiment of method 400 shown in FIG. 4 is described here as being performed in connection with two technicians installing a connection between a port 106 of an item of patching equipment and a port 146 of other equipment 144 (which includes a fixed cable 142) and, in connection therewith, using cable testers 152 to test and verify the installed connection.

Method 400 comprises capturing information about the installed connection and cabling (block 402). As noted above, in this exemplary embodiment, two technicians install a connection between an item of patching equipment 102 and an item of other equipment 144. The connection includes a fixed cable 142. The connection is terminated at the rear (or non-patching) side of the patching equipment 102 and of the other equipment 144 and is coupled, by the patching equipment 102 and the other equipment 144, respectively, to the port 106 and 146 on the front (or patching) side. In connection with doing this, the technicians use cable testers 152 to test and verify the installed connection. This can be done as described above in connection with FIG. 2 and can involve capturing identification and testing information using the cable testers 152.

Method 400 further comprises writing at least some of the captured information to a local storage device 184 (block 404).

After the technicians have installed, tested, and verified the connection and fixed cabling, the technician positioned near the port 106 of the patching equipment 102 can uses the user-interface of the cable tester 152 to cause it to write information that relates to the connection and cabling to the storage device 184 in the item of patching equipment 102 using the wireless interface 186. Also, the technician positioned near the other equipment 144 can use the user-interface of the cable tester 152 to cause it to write information that relates to the connection and cabling to the storage device 184 in the other equipment 144 using the wireless interface 186.

As noted above, the cable testers 152 include a wireless interface 180 that are compatible with the wireless interfaces 186 in the item of patching equipment 102 and other equipment 144. In this particular embodiment, the wireless interfaces 186 in the item of patching equipment 102 and other equipment 144 use NFC technology. As a result, the wireless interface 180 of the cable testers 152 implement NFC technology for powering the wireless interfaces 186 and the storage devices 184 and for writing and reading information to and from the storage devices 184 using NFC wireless links.

Various schemes can be used for storing information in the storage devices 184. For example, the information currently stored in the storage device 184 can be read. If the read information includes any information for the current port, that information can be replaced with the most-recent information that has been captured by the cable tester 152. If the read information does not include any information for the current port, the most-recent information for the port that has been captured by the cable tester 152 can be added to the read information. Then, information read from the storage device 184 along with any updated or added information for the current port is written back to the storage device 184. Other schemes can be used.

Method 400 further comprises reading information from the storage device 184 (block 406). For example, a portable device (such as a smartphone or tablet 188) can be positioned near the wireless interface 186 of the current item of patching equipment 102 or the current item of other equipment 144 in order to read information about the ports and associated fixed connections and cabling stored in the associated storage device 184.

This can be done any time after the connection and associated cabling have been installed and tested and the related information has been captured and locally stored in the storage device 184.

Various schemes can be used for reading information from the storage devices 184. For example, each such read transaction can involve all of the information stored in the storage device 184 being read from it. For example, in the case of the storage device 184 in the patching equipment 102, reading information from the associated storage device 184 would involve reading the information for all of the ports 106. Other schemes can be used.

By using embodiments of method 400, information about the installed connection and fixed cabling can be locally stored in a storage device 184 associated with, and local to, the relevant ports. Thereafter, at an appropriate and convenient time, the stored information can read by a device (such as a smartphone or tablet 188) that is near one of the relevant ports. This can be done to obtain information about the port and the associated connection and fixed cabling without having to access the AIM system 138 and AIM database 140. This is useful in situations where the AIM system 138 has not been configured and/or where the AIM database 140 has not been created or populated. This is also useful in situations where the AIM system 138 and the AIM database 140 are not available.

Embodiments of method 400 are able to provide these advantages even though power is not available at the patching equipment 102 or the other equipment 144. In the case of the patching equipment 102, this can occur, for example, during the initial installation of the AIM system 100 or during major changes to the AIM system 100. Wall outlets and consolidation points typically are not otherwise powered. In all of these situations, a technician using a portable device is still able to write information to and read information from the storage devices 184.

Also, as noted above, each storage device 184 and wireless interface 186 in some of the patching equipment 102 or other equipment 144 can be configured to transmit a beacon that includes at least some of the information stored in the storage device 184. Moreover, each storage device 184 and wireless interface 186 can be configured to join a mesh network (including, for example, other similarly configured patching equipment 102 or other equipment 144 and a gateway 187 connected to an external network 136) to enable a remote external device to write information to and read information from the storage device 184 using the wireless interface 186. For example, the AIM manager 138 can access information stored in the storage device 184 via the gateway 187 and the mesh network. A suitable mesh networking protocol can be used (for example, BLUETOOTH LOW ENERGY).

Furthermore, although methods 200, 300, and 400 are shown in FIGS. 2, 3, and 4 as separate methods, it is to be understood that methods 200, 300, and 400 can be combined or otherwise used together.

The methods and techniques described here may be implemented in digital electronic circuitry, or with a programmable processor (for example, a special-purpose processor or a general-purpose processor such as a computer) firmware, software, or in combinations of them. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed application-specific integrated circuits (ASICs).

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

Example Embodiments

Example 1 includes a system comprising: patching equipment comprising: one or more ports to which cables can be connected; at least one sensor associated with at least one of the ports to detect when a cable is connected to said at least one port; and a controller communicatively coupled to the patching equipment; wherein the controller is configured to do the following: detect that a cable has been connected to said at least one port of the patching equipment; detect that the cable is no longer connected to said at least one port of the patching equipment; and in response to detecting that the cable is no longer connected to said at least one port of the patching equipment: download, from a cable tester, information associated with fixed cabling coupled to said at least one port of the patching equipment; associate the downloaded information with said at least one port of the patching equipment; and locally store the downloaded information and association information at the controller.

Example 2 includes the system of Example 1, wherein the patching equipment comprises a plurality of ports. Example 3 includes the system of any of Examples 1-2, wherein the at least one sensor is associated with: a single port of the patching equipment, all of the ports of the patching equipment, or a subset of the ports of the patching equipment. Example 4 includes the system of any of Examples 2-3, wherein the patching equipment comprises a plurality of sensors, wherein each sensor is associated with: a single port of the patching equipment, all of the ports of the patching equipment, or a subset of the ports of the patching equipment.

Example 5 includes the system of any of Examples 1-4, wherein the controller is configured to establish a communication link with the cable tester. Example 6 includes the system of any of Examples 1-5, wherein the downloaded information comprises identification information, location information, and testing information. Example 7 includes the system of Example 6, wherein the identification information comprises at least one of: an identifier assigned to the cable, an identifier assigned to said at least one port, an identifier assigned to the patching equipment, an identifier assigned to a bundle of cables. Example 8 includes the system of any of Examples 6-7, wherein the location information comprises at least one of: a building, floor, room, row, rack, or indoor coordinates where any of the following are located: said at least one port, the patching equipment, at least one end of said cable, and at least one end of a connection implemented using said cable; and a name or identifier associated with any of the following: a second port to which said cable is also connected and equipment of which the second port is part. Example 9 includes the system of any of Examples 6-8, wherein the testing information comprises information about one or more of the following about the fixed cabling: test date, test time, connectivity, length, attenuation, wire map, near-end crosstalk (NEXT), impedance, capacitance, resistance, delay, delay skew, equal level far-end crosstalk (ELFEXT), attenuation-to-crosstalk ratio (ACR), fiber type, insertion loss, measured loss at 850 nanometers (nm), limit loss at 850 nm, margin loss at 850 nm, measured loss at 1300 nm, limit loss at 1300 nm, and margin loss at 1300 nm.

Example 10 includes the system of any of Examples 1-9, wherein the fixed cabling is connected to other equipment, wherein the other equipment comprises at least one of an outlet, a consolidation point, and another item of patching equipment. Example 11 includes the system of Example 10, wherein the other equipment further comprises a storage device and a wireless interface, wherein the other equipment is configured to enable an external device to write information to and read information from the storage device using the wireless interface. Example 12 includes the system of Example 11, wherein the other equipment comprises an outlet that includes a faceplate and a port, wherein the storage device is mounted to at least one of the port of the outlet and the faceplate of the outlet. Example 13 includes the system of any of Examples 11-12, wherein the other equipment comprises a plurality of ports, wherein the outlet comprises a plurality of storage devices. Example 14 includes the system of Example 13, wherein each storage device is associated with a respective single port of the other equipment, all of the ports of the other equipment, or a respective subset of ports of the other equipment.

Example 15 includes the system of any of Examples 11-14, wherein the wireless interface of the other equipment is configured to transmit a beacon that includes at least some of the information stored in the storage device. Example 16 includes the system of any of Examples 11-15, wherein the wireless interface of the other equipment is configured to join a mesh network to enable a remote external device to write information to and read information from the storage device using the wireless interface. Example 17 includes the system of any of Examples 11-16, wherein the other equipment is configured so that the storage device and the wireless interface are powered using at least one of: power received from the external device via the wireless interface, a battery, a solar cell, and mains or grid power.

Example 18 includes the system of any of Examples 1-17, wherein the fixed cabling comprises a horizontal run cable. Example 19 includes the system of any of Examples 1-18, wherein the patching equipment further comprises a storage device and a wireless interface, wherein the patching equipment is configured to enable an external device to write information to and read information from the storage device using the wireless interface. Example 20 includes the system of Example 19, wherein the patching equipment comprises a plurality of ports, wherein the other equipment comprises a plurality of storage devices. Example 21 includes the system of Example 20, wherein each storage device is associated with a respective port of the patching equipment, all of the ports of the patching equipment, or a respective subset of ports of the patching equipment. Example 22 includes the system of any of Examples 19-21, wherein the wireless interface of the patching equipment is configured to transmit a beacon that includes at least some of the information stored in the storage device. Example 23 includes the system of any of Examples 19-22, wherein the wireless interface of the patching equipment is configured to join a mesh network to enable a remote external device to write information to and read information from the storage device using the wireless interface.

Example 24 includes the system of any of Examples 19-23, wherein the patching equipment is configured so that the storage device and the wireless interface are powered using at least one of: power received from the external device via the wireless interface, a battery, a solar cell, and mains or grid power. Example 25 includes the system of any of Examples 1-24, wherein the controller is implemented as one of: a unit separate from the patching equipment and a part of the patching equipment.

Example 26 includes a method comprising: detecting that a cable has been connected to a port of patching equipment; detecting that the cable is no longer connected to said port of the patching equipment; in response to detecting that the cable is no longer connected to said port of the patching equipment: downloading, to a controller communicatively coupled to the patching equipment, information from a cable tester associated with fixed cabling coupled to said port of the patching equipment; associating the downloaded information with said port of the patching equipment; and locally storing the downloaded information and association information at the controller.

Example 27 includes the method of Example 26, wherein detecting that the cable has been connected to said port of patching equipment comprises using a sensor associated with said port to detect that the cable been connected to said port; and wherein detecting that the cable is no longer connected to said port of the patching equipment comprises: using the sensor associated with said port to detect that the cable is no longer connected to said port of the patching equipment. Example 28 includes the method of Example 27, wherein the patching equipment comprises a plurality of ports. Example 29 includes the method of Example 28, wherein at least one sensor is associated with: a single port of the patching equipment, all of the ports of the patching equipment, or a subset of the ports of the patching equipment. Example 30 includes the method of any of Examples 28-29, wherein the patching equipment comprises a plurality of sensors, wherein each sensor is associated with one of: a respective single port of the patching equipment, all of the ports of the patching equipment, or a respective subset of the ports of the patching equipment.

Example 31 includes the method of any of Examples 26-30, further comprising establishing a communication link between the controller and the cable tester. Example 32 includes the method of any of Examples 26-31, wherein the controller is implemented as one of: a unit separate from the patching equipment and a part of the patching equipment.

Example 33 includes a system comprising: software executing on a computer that is coupled to a network; patching equipment comprising: one or more ports to which cables can be connected; at least one sensor associated with at least one of the ports to detect when a cable is connected to said at least one port; and a controller communicatively coupled to the patching equipment and the computer via the network; wherein the software executing on the computer is configured to do the following: identify the controller associated with a port of the patching equipment; obtain information that is locally stored by the identified controller; and create and/or populate an object stored by the computer with at least some of the information obtained from the identified controller.

Example 34 includes the system of Example 33, wherein the information that is locally stored by the identified controller comprises: information associated with fixed cabling coupled to said at least one port of the patching equipment that was downloaded from a cable tester; and association information that associates the downloaded information with the port of the patching equipment. Example 35 includes the system of any of Examples 33-34, wherein the information that is locally stored by the identified controller comprises identification information, location information, and testing information. Example 36 includes the system of Example 35, wherein the identification information comprises at least one of: an identifier assigned to the cable, an identifier assigned to said at least one port, an identifier assigned to the patching equipment, an identifier assigned to a bundle of cables. Example 37 includes the system of any of Examples 35-36, wherein the location information comprises at least one of: a building, floor, room, row, rack, or indoor coordinates where any of the following are located: said at least one port, the patching equipment, at least one end of said cable, and at least one end of a connection implemented using said cable; and a name or identifier associated with any of the following: a second port to which said cable is also connected and equipment of which the second port is part. Example 38 includes the system of any of Examples 35-37, wherein the testing information comprises information about one or more of the following about the fixed cabling: test date, test time, connectivity, length, attenuation, wire map, near-end crosstalk (NEXT), impedance, capacitance, resistance, delay, delay skew, equal level far-end crosstalk (ELFEXT), and attenuation-to-crosstalk ratio (ACR), fiber type, insertion loss, measured loss at 850 nanometers (nm), limit loss at 850 nm, margin loss at 850 nm, measured loss at 1300 nm, limit loss at 1300 nm, and margin loss at 1300 nm.

Example 39 includes a method comprising: identifying a controller associated with a port of a patching equipment to which a cable can be connected; obtaining information that is locally stored by the identified controller; and create and/or populate an object stored by a computer with at least some of the information obtained from the identified controller.

Example 40 includes the method of Example 39, wherein the information that is locally stored by the identified controller comprises: information associated with fixed cabling coupled to said at least one port of the patching equipment that was downloaded from a cable tester; and association information that associates the downloaded information with the port of the patching equipment. Example 41 includes the method of any of Examples 39-40, wherein the information that is locally stored by the identified controller comprises identification information, location information, and testing information. Example 42 includes the method of Example 41, wherein the identification information comprises at least one of: an identifier assigned to the cable, an identifier assigned to said at least one port, an identifier assigned to the patching equipment, an identifier assigned to a bundle of cables. Example 43 includes the method of any of Examples 41-42, wherein the location information comprises at least one of: a building, floor, room, row, rack, or indoor coordinates where any of the following are located: said at least one port, the patching equipment, at least one end of said cable, and at least one end of a connection implemented using said cable; and a name or identifier associated with any of the following: a second port to which said cable is also connected and equipment of which the second port is part. Example 44 includes the method of any of Examples 41-43, wherein the testing information comprises information about one or more of the following about the fixed cabling: test date, test time, connectivity, length, attenuation, wire map, near-end crosstalk (NEXT), impedance, capacitance, resistance, delay, delay skew, equal level far-end crosstalk (ELFEXT), and attenuation-to-crosstalk ratio (ACR), fiber type, insertion loss, measured loss at 850 nanometers (nm), limit loss at 850 nm, margin loss at 850 nm, measured loss at 1300 nm, limit loss at 1300 nm, and margin loss at 1300 nm.

Example 45 includes an outlet comprising: a port to connect a cable to, wherein the outlet is configured so that fixed cabling can be communicatively coupled to the port; a storage device; and a wireless interface to communicate with an external device that is external from the outlet; wherein the outlet is configured to write information to the storage device, the written information received via the wireless interface; and read information from the storage device and communicate the read information via the wireless interface.

Example 46 includes the outlet of Example 45, further comprising a faceplate to which the port is mounted, and wherein the storage device is mounted to one of the port or the faceplate. Example 47 includes the outlet of Example 46, wherein the wireless interface is mounted to one of the port or the faceplate. Example 48 includes the outlet of any of Examples 45-47, wherein the outlet comprises a plurality of ports, wherein the outlet comprises a plurality of storage devices. Example 49 includes the outlet of Example 48, wherein each storage device is associated with a respective port of the outlet, all of the ports of the outlet, or a respective subset of ports of the outlet.

Example 50 includes the outlet of any of Examples 45-49, wherein the wireless interface of the outlet is configured to transmit a beacon that includes at least some of the information stored in the storage device. Example 51 includes the outlet of any of Examples 45-50, wherein the wireless interface of the outlet is configured to join a mesh network to enable a remote external device to write information to and read information from the storage device using the wireless interface. Example 52 includes the outlet of any of Examples 45-51, wherein the outlet is configured so that the storage device and the wireless interface are powered using at least one of: power received from the external device via the wireless interface, a battery, a solar cell, and mains or grid power.

Example 53 includes the outlet of any of Examples 45-52, wherein the wireless interface comprises a near-field communication (NFC) interface. Example 54 includes the outlet of any of Examples 45-53, wherein the information written to the storage device comprises information captured by a cable tester and communicated to the outlet via the wireless interface. Example 55 includes the outlet of any of Examples 45-54, wherein the information read from the storage device is communicated to a portable device via the wireless interface. Example 56 includes the outlet of any of Examples 45-55, wherein the portable device comprises a smartphone or tablet.

Example 57 includes a method comprising: capturing information about a connection to a port of an outlet, the connection implemented using fixed cable; writing information to a storage device included in the outlet, the written information received via a wireless interface included in the outlet; and reading information from the storage device and communicating the read information via the wireless interface.

Example 58 includes the method of Example 57, wherein the wireless interface of the outlet is configured to transmit a beacon that includes at least some of the information stored in the storage device. Example 59 includes the method of any of Examples 57-58, wherein the wireless interface of the outlet is configured to join a mesh network to enable a remote external device to write information to and read information from the storage device using the wireless interface. Example 60 includes the method of any of Examples 57-59, wherein the outlet is configured so that the storage device and the wireless interface are powered using at least one of: power received from the external device via the wireless interface, a battery, a solar cell, and mains or grid power.

Example 61 includes the method of any of Examples 57-60, wherein the wireless interface comprises a near-field communication (NFC) interface. Example 62 includes the method of any of Examples 57-61, wherein the information written to the storage device comprises information captured by a cable tester and communicated to the outlet via the wireless interface. Example 63 includes the method of any of Examples 57-62, wherein the information read from the storage device is communicated to a portable device via the wireless interface. Example 64 includes the method of any of Examples 57-63, wherein the portable device comprises a smartphone or tablet.

Example 65 includes patching equipment comprising: one or more ports, each of which is configured to connect a cable thereto, wherein the patching equipment is configured so that fixed cabling can be communicatively coupled to each port; a storage device; and a wireless interface to communicate with an external device that is external from the patching equipment; wherein the patching equipment is configured to write information to the storage device, the written information received via the wireless interface; and read information from the storage device and communicate the read information via the wireless interface.

Example 66 includes the patching equipment of Example 65, wherein the outlet is configured so that power for the storage device and wireless interface is provided from the external device via the wireless interface. Example 67 includes the patching equipment of any of Examples 65-66, wherein the wireless interface comprises a near-field communication (NFC) interface. Example 68 includes the patching equipment of any of Examples 65-67, wherein the information written to the storage device comprises information captured by a cable tester and communicated to the patching equipment via the wireless interface. Example 69 includes the patching equipment of any of Examples 65-68, wherein the information read from the storage device is communicated to a portable device via the wireless interface. Example 70 includes the patching equipment of any of Examples 65-69, wherein the portable device comprises a smartphone or tablet.

Example 71 includes a method comprising: capturing information about a connection to a port of patching equipment, the connection implemented using fixed cable; writing information to a storage device included in the patching equipment, the written information received via a wireless interface included in the outlet; and reading information from the storage device and communicating the read information via the wireless interface.

Example 72 includes the method of Example 71, wherein the patching equipment is configured so that power for the storage device and wireless interface is provided from the external device via the wireless interface. Example 73 includes the method of any of Examples 71-72, wherein the wireless interface comprises a near-field communication (NFC) interface. Example 74 includes the method of any of Examples 71-73, wherein the information written to the storage device comprises information captured by a cable tester and communicated to the patching equipment via the wireless interface. Example 75 includes the method of any of Examples 71-74, wherein the information read from the storage device is communicated to a portable device via the wireless interface. Example 76 includes the method of any of Examples 71-75, wherein the portable device comprises a smartphone or tablet.

Example 77 includes a consolidation point comprising: a port to connect a cable to, wherein the consolidation point is configured so that fixed cabling can be communicatively coupled to the port; a storage device; and a wireless interface to communicate with an external device that is external from the outlet; wherein the consolidation point is configured to write information to the storage device, the written information received via the wireless interface; and read information from the storage device and communicate the read information via the wireless interface.

Example 78 includes the consolidation point of Example 77, wherein the consolidation point comprises a plurality of ports, wherein the consolidation point comprises a plurality of storage devices. Example 79 includes the consolidation point of Example 78, wherein each storage device is associated with a respective port of the consolidation point, all of the ports of the consolidation point, or a respective subset of ports of the consolidation point. Example 80 includes the consolidation point of any of Examples 77-79, wherein the wireless interface of the consolidation point is configured to transmit a beacon that includes at least some of the information stored in the storage device. Example 81 includes the consolidation point of any of Examples 77-80, wherein the wireless interface of the consolidation point is configured to join a mesh network to enable a remote external device to write information to and read information from the storage device using the wireless interface.

Example 82 includes the consolidation point of any of Examples 77-81, wherein the consolidation point is configured so that the storage device and the wireless interface are powered using at least one of: power received from the external device via the wireless interface, a battery, a solar cell, and mains or grid power. Example 83 includes the consolidation point of any of Examples 77-82, wherein the wireless interface comprises a near-field communication (NFC) interface. Example 84 includes the consolidation point of any of Examples 77-83, wherein the information written to the storage device comprises information captured by a cable tester and communicated to the consolidation point via the wireless interface. Example 85 includes the consolidation point of any of Examples 77-84, wherein the information read from the storage device is communicated to a portable device via the wireless interface. Example 86 includes the consolidation point of any of Examples 77-85, wherein the portable device comprises a smartphone or tablet.

Example 87 includes a method comprising: capturing information about a connection to a port of a consolidation point, the connection implemented using a fixed cable; writing information to a storage device included in the consolidation point, the written information received via a wireless interface included in the consolidation point; and reading information from the storage device and communicating the read information via the wireless interface.

Example 88 includes the method of Example 87, wherein the wireless interface of the consolidation point is configured to transmit a beacon that includes at least some of the information stored in the storage device. Example 89 includes the method of any of Examples 87-88, wherein the wireless interface of the consolidation point is configured to join a mesh network to enable a remote external device to write information to and read information from the storage device using the wireless interface. Example 90 includes the method of any of Examples 87-89, wherein the consolidation point is configured so that the storage device and the wireless interface are powered using at least one of: power received from the external device via the wireless interface, a battery, a solar cell, and mains or grid power.

Example 91 includes the method of any of Examples 87-90, wherein the wireless interface comprises a near-field communication (NFC) interface. Example 92 includes the method of any of Examples 87-91, wherein the information written to the storage device comprises information captured by a cable tester and communicated to the consolidation point via the wireless interface. Example 93 includes the method of any of Examples 87-92, wherein the information read from the storage device is communicated to a portable device via the wireless interface. Example 94 includes the method of any of Examples 87-93, wherein the portable device comprises a smartphone or tablet.

The invention claimed is:

1. A system comprising:
  patching equipment comprising:
    one or more ports to which cables can be connected;
    at least one sensor associated with at least one of the ports to detect when a cable is connected to said at least one port; and
  a controller communicatively coupled to the patching equipment;
  wherein the controller is configured to do the following:
    detect that a cable has been connected to said at least one port of the patching equipment;
    detect that the cable is no longer connected to said at least one port of the patching equipment; and
    in response to detecting that the cable is no longer connected to said at least one port of the patching equipment:
      download, from a cable tester, information associated with fixed cabling coupled to said at least one port of the patching equipment;
      associate the downloaded information with said at least one port of the patching equipment; and
      locally store the downloaded information and association information at the controller.

2. The system of claim 1, wherein the patching equipment comprises a plurality of ports.

3. The system of claim 2, wherein the at least one sensor is associated with: a single port of the patching equipment, all of the ports of the patching equipment, or a subset of the ports of the patching equipment.

4. The system of claim 2, wherein the patching equipment comprises a plurality of sensors, wherein at least one sensor of the plurality of sensors is associated with one of: a single port of the patching equipment, all of the ports of the patching equipment, or a subset of the ports of the patching equipment.

5. The system of claim 1, wherein the controller is configured to establish a communication link with the cable tester.

6. The system of claim 1, wherein the downloaded information comprises identification information, location information, and testing information.

7. The system of claim 6, wherein the identification information comprises at least one of: an identifier assigned to the cable, an identifier assigned to said at least one port, an identifier assigned to the patching equipment, an identifier assigned to a bundle of cables.

8. The system of claim 6, wherein the location information comprises at least one of:
  a building, floor, room, row, rack, or indoor coordinates where any of the following are located: said at least one port, the patching equipment, at least one end of said cable, and at least one end of a connection implemented using said cable; and
  a name or identifier associated with any of the following: a second port to which said cable is also connected and equipment of which the second port is part.

9. The system of claim 6, wherein the testing information comprises information about one or more of the following about the fixed cabling: test date, test time, connectivity, length, attenuation, wire map, near-end crosstalk (NEXT), impedance, capacitance, resistance, delay, delay skew, equal level far-end crosstalk (ELFEXT), attenuation-to-crosstalk ratio (ACR), fiber type, insertion loss, measured loss at 850 nanometers (nm), limit loss at 850 nm, margin loss at 850 nm, measured loss at 1300 nm, limit loss at 1300 nm, and margin loss at 1300 nm.

10. The system of claim 1, wherein the fixed cabling is connected to other equipment, wherein the other equipment comprises at least one of an outlet, a consolidation point, and another item of patching equipment.

11. The system of claim 10, wherein the other equipment further comprises a storage device and a wireless interface, wherein the other equipment is configured to enable an external device to write information to and read information from the storage device using the wireless interface.

12. The system of claim 11, wherein the other equipment comprises an outlet that includes a faceplate and a port, wherein the storage device is mounted to at least one of the port of the outlet and the faceplate of the outlet.

13. The system of claim 11, wherein the other equipment comprises a plurality of ports, wherein the outlet comprises a plurality of storage devices.

14. The system of claim 13, wherein each storage device is associated with a respective single port of the other equipment, all of the ports of the other equipment, or a respective subset of ports of the other equipment.

15. The system of claim 11, wherein the wireless interface of the other equipment is configured to transmit a beacon that includes at least some of the information stored in the storage device.

16. The system of claim 11, wherein the wireless interface of the other equipment is configured to join a mesh network to enable a remote external device to write information to and read information from the storage device using the wireless interface.

17. The system of claim 11, wherein the other equipment is configured so that the storage device and the wireless interface are powered using at least one of: power received from the external device via the wireless interface, a battery, a solar cell, and mains or grid power.

18. The system of claim 1, wherein the fixed cabling comprises a horizontal run cable.

19. The system of claim 1, wherein the patching equipment further comprises a storage device and a wireless interface, wherein the patching equipment is configured to enable an external device to write information to and read information from the storage device using the wireless interface.

20. The system of claim 19, wherein the patching equipment comprises a plurality of ports, wherein the patching equipment comprises a plurality of storage devices.

21. The system of claim 20, wherein at least one storage device of the plurality of storage devices is associated with one of a respective port of the patching equipment, all of the ports of the patching equipment, or a respective subset of ports of the patching equipment.

22. The system of claim 19, wherein the wireless interface of the patching equipment is configured to transmit a beacon that includes at least some of the information stored in the storage device.

23. The system of claim 19, wherein the wireless interface of the patching equipment is configured to join a mesh network to enable a remote external device to write information to and read information from the storage device using the wireless interface.

24. The system of claim 19, wherein the patching equipment is configured so that the storage device and the wireless interface are powered using at least one of: power received from the external device via the wireless interface, a battery, a solar cell, and mains or grid power.

25. The system of claim 1, wherein the controller is implemented as one of: a unit separate from the patching equipment and a part of the patching equipment.

26. A method comprising:
    detecting that a cable has been connected to a port of patching equipment;
    detecting that the cable is no longer connected to said port of the patching equipment;
    in response to detecting that the cable is no longer connected to said port of the patching equipment:
        downloading from a cable tester, to a controller communicatively coupled to the patching equipment, information associated with fixed cabling coupled to said port of the patching equipment;
        associating the downloaded information with said port of the patching equipment; and
        locally storing the downloaded information and association information at the controller.

27. The method of claim 26, wherein detecting that the cable has been connected to said port of patching equipment comprises using a sensor associated with said port to detect that the cable been connected to said port; and
    wherein detecting that the cable is no longer connected to said port of the patching equipment comprises: using the sensor associated with said port to detect that the cable is no longer connected to said port of the patching equipment.

28. The method of claim 27, wherein the patching equipment comprises a plurality of ports.

29. The method of claim 28, wherein at least one sensor is associated with:
    a single port of the patching equipment, all of the ports of the patching equipment, or a subset of the ports of the patching equipment.

30. The method of claim 28, wherein the patching equipment comprises a plurality of sensors, wherein each sensor is associated with one of: a respective single port of the patching equipment, all of the ports of the patching equipment, or a respective subset of the ports of the patching equipment.

31. The method of claim 26, further comprising establishing a communication link between the controller and the cable tester.

32. The method of claim 26, wherein the controller is implemented as one of: a unit separate from the patching equipment and a part of the patching equipment.

\* \* \* \* \*